(12) United States Patent
Lundy et al.

(10) Patent No.: US 10,824,860 B2
(45) Date of Patent: Nov. 3, 2020

(54) MIRROR ASSEMBLY INCORPORATING A SCANNING APPARATUS

(71) Applicant: Gentex Corporation, Zeeland, MI (US)

(72) Inventors: Eric S. Lundy, Grand Rapids, MI (US); Jason D. Hallack, Allendale, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 16/504,677

(22) Filed: Jul. 8, 2019

(65) Prior Publication Data

US 2020/0019775 A1    Jan. 16, 2020

Related U.S. Application Data

(60) Provisional application No. 62/697,146, filed on Jul. 12, 2018.

(51) Int. Cl.
*G06K 9/00* (2006.01)
*H05K 5/00* (2006.01)
(Continued)

(52) U.S. Cl.
CPC ............ *G06K 9/00617* (2013.01); *B60R 1/12* (2013.01); *B60R 11/0235* (2013.01); *B60R 11/04* (2013.01); *G06K 9/00832* (2013.01); *H04N 5/2253* (2013.01); *H04N 5/2257* (2013.01); *H05K 5/0017* (2013.01); *H05K 5/0204* (2013.01); *B60R 2001/1215* (2013.01); *B60R 2001/1223* (2013.01); *B60R 2011/0026* (2013.01); *B60R 2011/0028* (2013.01); *B60R 2011/0085* (2013.01)

(58) Field of Classification Search
CPC .......... G06K 9/00617; G06K 9/00832; H05K 5/0017; H05K 5/0204; H04N 5/2253; H04N 5/2257; B60R 11/0235; B60R 1/12; B60R 11/04; B60R 2001/1223; B60R 2011/0085; B60R 2011/0026; B60R 2011/0028; B60R 2001/1215; B60R 2001/1253; B60R 1/04
See application file for complete search history.

(56) References Cited

U.S. PATENT DOCUMENTS 5,877,897 A * 3/1999 Schofield .............. B60S 1/0822
                                                    359/604
5,928,572 A    7/1999 Tonar et al.
(Continued)

FOREIGN PATENT DOCUMENTS

WO    9842796 A1    10/1998
WO    9902621 A1    1/1999

*Primary Examiner* — Marnie A Matt
(74) *Attorney, Agent, or Firm* — Price Heneveld LLP; Bradley D. Johnson

(57) ABSTRACT

A scanning apparatus for a vehicle comprises a display housing comprising a display device forming a display plane and a support housing in supportive connection with the display housing. The support housing is in connection with a connection surface of a portion of the vehicle and forms an interior cavity extending substantially perpendicular from the connection surface. A first PCB is disposed in the interior cavity, wherein the first PCB comprises a plurality of planar faces terminating at a plurality of edges. The planar faces extend substantially perpendicular to the connection surface.

20 Claims, 5 Drawing Sheets

(51) Int. Cl.
   *H05K 5/02*     (2006.01)
   *H04N 5/225*    (2006.01)
   *B60R 11/02*    (2006.01)
   *B60R 1/12*     (2006.01)
   *B60R 11/04*    (2006.01)
   *B60R 11/00*    (2006.01)

(56) References Cited

U.S. PATENT DOCUMENTS

| | | |
|---|---|---|
| 5,998,617 A | 12/1999 | Srinivasa et al. |
| 6,020,987 A | 2/2000 | Baumann et al. |
| 6,037,471 A | 3/2000 | Srinivasa et al. |
| 6,137,620 A | 10/2000 | Guarr et al. |
| 6,141,137 A | 10/2000 | Byker et al. |
| 6,193,912 B1 | 2/2001 | Thieste et al. |
| 6,241,916 B1 | 6/2001 | Claussen et al. |
| 6,249,369 B1 | 6/2001 | Theiste et al. |
| 6,519,072 B2 | 2/2003 | Nishikitani et al. |
| 6,572,233 B1 | 6/2003 | Northman et al. |
| 8,094,002 B2 | 1/2012 | Schofield et al. |
| 8,201,800 B2 | 6/2012 | Filipiak |
| 8,210,695 B2 | 7/2012 | Roth et al. |
| 8,237,909 B2 | 8/2012 | Ostreko et al. |
| 8,246,183 B2 | 8/2012 | Kulas et al. |
| 8,264,761 B2 | 9/2012 | Cammenga et al. |
| 8,339,526 B2 | 12/2012 | Minikey, Jr. et al. |
| 8,411,245 B2 | 4/2013 | Lee et al. |
| 8,643,931 B2 | 2/2014 | Cammenga et al. |
| 8,646,924 B2 | 2/2014 | Roth et al. |
| 8,814,373 B2 | 8/2014 | Steel et al. |
| 8,827,517 B2 | 9/2014 | Cammenga et al. |
| 8,885,240 B2 | 11/2014 | Roth et al. |
| 8,925,891 B2 | 1/2015 | Van Huis et al. |
| 8,960,629 B2 | 2/2015 | Rizk et al. |
| 9,056,584 B2 | 6/2015 | Fish, Jr. et al. |
| 9,174,577 B2 | 11/2015 | Busscher et al. |
| 9,244,249 B2 | 1/2016 | Kim et al. |
| 9,316,347 B2 | 4/2016 | Roth |
| 9,701,248 B2 | 7/2017 | Neuman et al. |
| 9,838,653 B2 | 12/2017 | Fish, Jr. et al. |
| 9,843,777 B2 | 12/2017 | Schofield et al. |
| 9,950,708 B1* | 4/2018 | Cullinane ............ B60W 30/095 |
| 10,191,348 B2 | 1/2019 | Luten et al. |
| 10,345,679 B2 | 7/2019 | Brandenburg et al. |
| 10,687,416 B2* | 6/2020 | Kang ................... H05K 7/1427 |
| 2013/0208428 A1* | 8/2013 | Hui ...................... H05K 5/0017 |
| | | 361/720 |
| 2013/0229571 A1* | 9/2013 | Martinez ................ G03B 17/04 |
| | | 348/374 |
| 2018/0093619 A1* | 4/2018 | Han ......................... B60T 7/22 |
| 2018/0099612 A1 | 4/2018 | Weller et al. |

* cited by examiner

MIRROR ASSEMBLY INCORPORATING A SCANNING APPARATUS

CROSS-REFERENCE TO RELATED APPLICATIONS

This application claims priority under 35 U.S.C. § 119(e) and the benefit of U.S. Provisional Application No. 62/697,146 entitled MIRROR ASSEMBLY INCORPORATING A SCANNING APPARATUS, filed on Jul. 12, 2018, by Eric S. Lundy et al., the entire disclosure of which is incorporated herein by reference.

TECHNOLOGICAL FIELD

The present invention generally relates to a mirror assembly, and more particularly, to a mirror assembly comprising a biometric scanner.

SUMMARY OF THE DISCLOSURE

According to one aspect of the present disclosure, a scanning apparatus for a vehicle configured to process a biometric scanning operation is disclosed. The scanning apparatus comprises a display housing comprising a display device forming a display plane and a support housing in supportive connection with the display housing. The support housing is in connection with a connection surface of a portion of the vehicle and forms an interior cavity extending substantially perpendicular from the connection surface. A first PCB is disposed in the interior cavity, wherein the first PCB comprises a plurality of planar faces terminating at a plurality of edges. The planar faces extend substantially perpendicular to the connection surface.

According to another aspect of the present disclosure, a scanning apparatus for a vehicle configured to process a biometric scanning operation is disclosed. The scanning apparatus comprises a support housing in connection with a connection surface of a portion of the vehicle. The support housing forms an interior cavity extending substantially perpendicular from the connection surface. A first PCB comprising a controller is disposed in the interior cavity. The first PCB comprises a plurality of planar faces extending substantially perpendicular to the connection surface. A display housing is in connection with the support housing via a connection interface and comprises an image sensor and a display device. A second PCB is disposed in the display housing and in communication with the display device, the image sensor, and the first PCB. The controller is configured process image data captured by the image sensor.

According to yet another aspect of the present disclosure, a scanning apparatus for a vehicle configured to process a biometric scanning operation is disclosed. The apparatus comprises a display housing comprising a display device forming a display plane and an image sensor configured to capture image data in the vehicle. A support housing in supportive connection with the display housing via a connection interface. The support housing is in connection with a connection surface of a portion of the vehicle and forms an interior cavity extending substantially perpendicular from the connection surface. A first PCB comprising a controller configured to process the image data is disposed in the interior cavity. The first PCB comprises a plurality of planar faces terminating at a plurality of edges. The planar faces extend substantially perpendicular to the connection surface. A connection interface is configured to support the display housing while providing a multi-axial rotation of the display housing relative to the support housing.

These and other features, advantages, and objects of the present invention will be further understood and appreciated by those skilled in the art by reference to the following specification, claims, and appended drawings.

DETAILED DESCRIPTION

Figure 1:
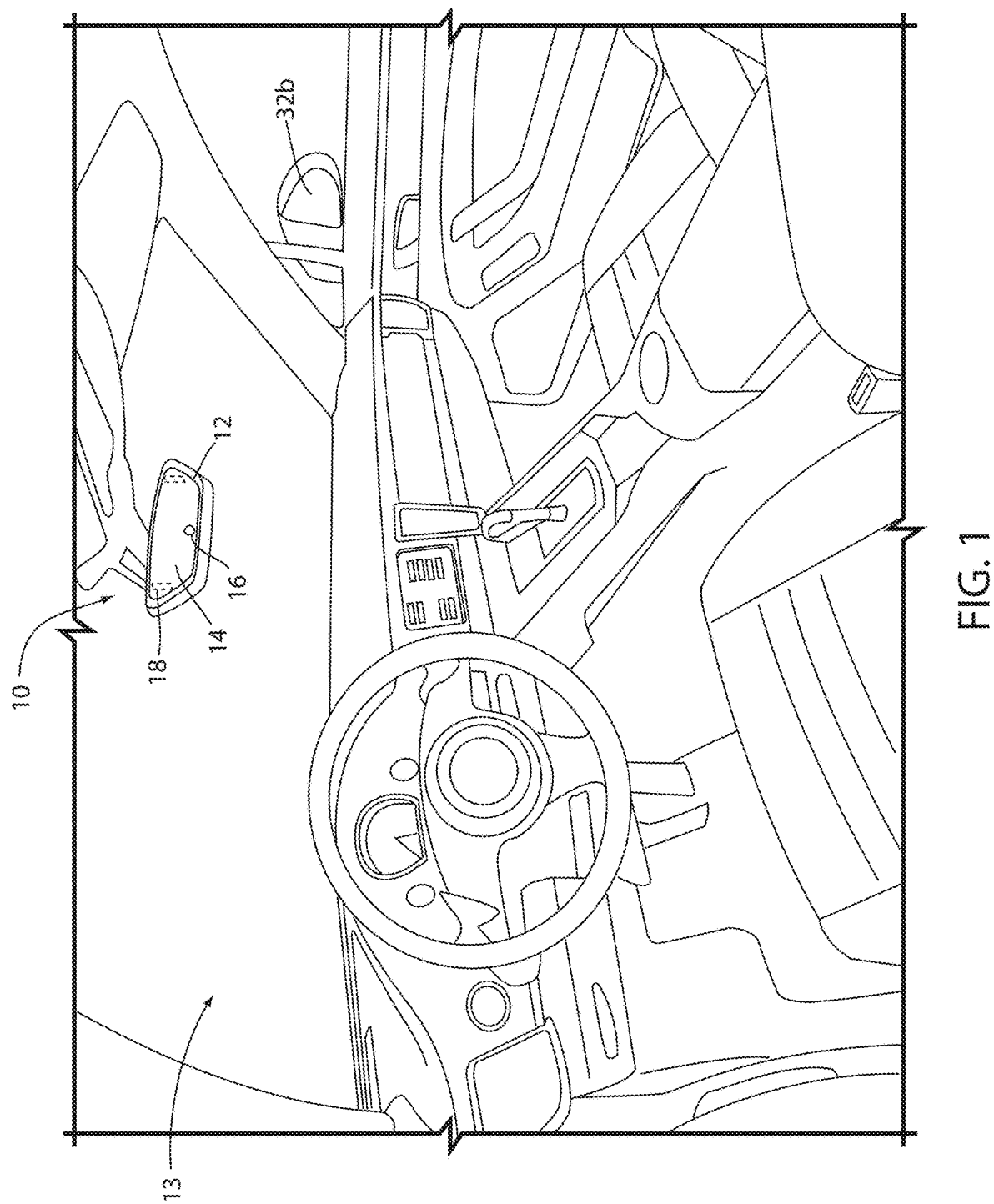
FIG. 1 is a projected view of a vehicle passenger compartment comprising mirror assembly incorporating a biometric authentication system.

For purposes of description herein, the terms "upper," "lower," "right," "left," "rear," "front," "vertical," "horizontal," and derivatives thereof shall relate to the invention as oriented in FIG. 1. Unless stated otherwise, the term "front" shall refer to the surface of the element closer to an intended viewer of the mirror element, and the term "rear" shall refer to the surface of the element further from the intended viewer of the mirror element. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element.

Figure 2:
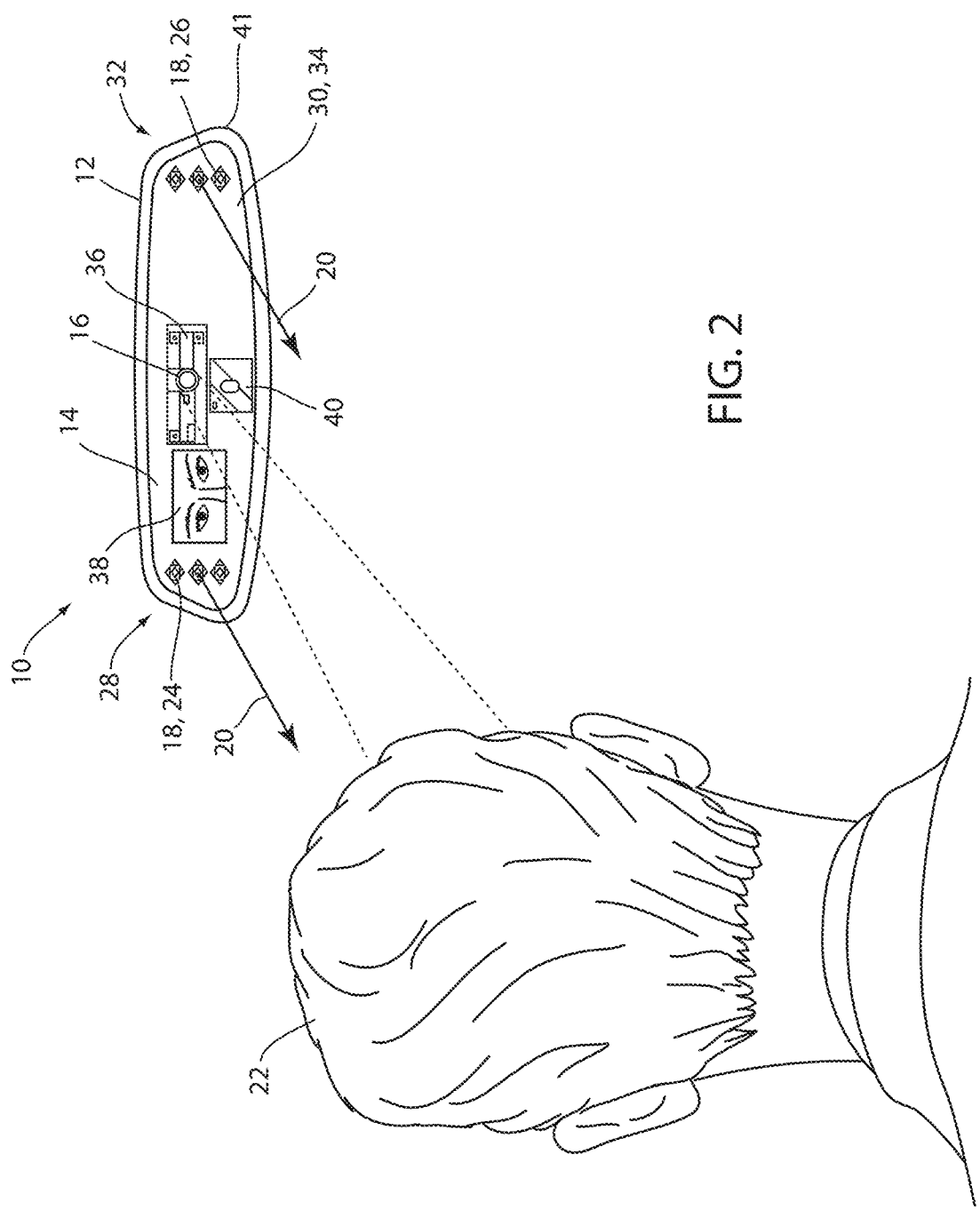
FIG. 2 is an illustrative view of a mirror assembly comprising a scanning apparatus.

Referring to FIGS. 1 and 2, the disclosure provides for a scanning apparatus 10 operable to perform an identification function. In an exemplary embodiment, the scanning apparatus 10 is incorporated in an interior rearview display assembly 12 configured to be incorporated in a passenger compartment 13 of an automotive vehicle. The display assembly 12 may correspond to an electro-optic assembly 14 having an electrochromic (EC) mirror element. The identification function may correspond to an eye-scan-identification function. In this configuration, the scanning apparatus 10 may provide for an interior rearview display assembly 12 configured to identify an operator of a vehicle based on the eye-scan identification function.

The eye-scan-identification function may utilize an infrared illumination of an iris of an eye in order to illuminate the eye for the identification. Such illumination may be optimized in conditions allowing for a high optical transmittance in the near-infrared (NIR) range. In some embodiments, the disclosure may provide for an electrochromic (EC) stack of the electro-optic assembly that may have a high light transmittance in the NIR range, for example, wavelengths of light ranging from 800 nm to 940 nm. Additionally, in some implementations, the electro-optic assembly may comprise a plurality of light sources configured to illuminate at least one iris of the operator of the vehicle.

To provide for the eye-scan-identification function, for example, an iris scan, an image sensor 16 may be disposed proximate a rear surface of the electro-optic assembly. The image sensor 16 may correspond to, for example, a digital charge-coupled device (CCD) or complementary metal-oxide-semiconductor (CMOS) active pixel sensor, although may not be limited to these exemplary devices. The image sensor 16 may be in communication with at least one light source 18, which may correspond to one or more infrared emitters configured to output an emission 20 of light in the NIR range. In this configuration, the image sensor 16 may be configured to selectively activate the one or more infrared emitters corresponding to the at least one light source 18 to illuminate the iris such that an identity of an operator 22 of the vehicle may be determined.

The infrared emitters or the light sources 18 may correspond to a plurality of infrared emitter banks. Each of the infrared emitter banks may comprise a plurality of light emitting diodes, which may be grouped in a matrix or otherwise grouped and disposed behind a rear surface of the electro-optic device. In an exemplary embodiment, the plurality of light sources 18 may correspond to a first emitter bank 24 and a second emitter bank 26. The first emitter bank 24 may be configured to output the emission in the NIR range from a first side portion 28 of a front surface 30 of the electro-optic assembly 14. The second emitter bank 26 may be configured to output the emission in the NIR range from a second side portion 32 of the front surface 30 of the electro-optic assembly 14, which may correspond to a mirror element 34 of the display assembly 12. In this configuration, the scanning apparatus 10 may be configured to illuminate the eyes of the operator 22 such that the image sensor 16 may capture image data including details of the irises of the eyes.

In an exemplary embodiment, each of the first emitter bank 24 and/or the second emitter bank 26 may correspond to more or fewer LEDs or banks of LEDs. In some embodiments comprising an electro-optic assembly having a high level of transmittance in the NIR range, the scanning apparatus 10 may utilize fewer or less intense LEDs. Examples of electro-optic assemblies having a high level of transmittance in the NIR range may correspond to assemblies comprising a transflective dielectric coating disposed on a fourth surface of the electro-optic assembly as further disclosed herein.

In some embodiments comprising an electro-optic assembly having a lower level of transmittance in the NIR range, the scanning apparatus 10 may utilize a greater number of or more intense LEDs. Electro-optic assemblies having a lower level of transmittance in the NIR range may correspond to assemblies comprising a metal-based, transflective coating disposed on a third surface of the electro-optic assembly.

Figure 3:
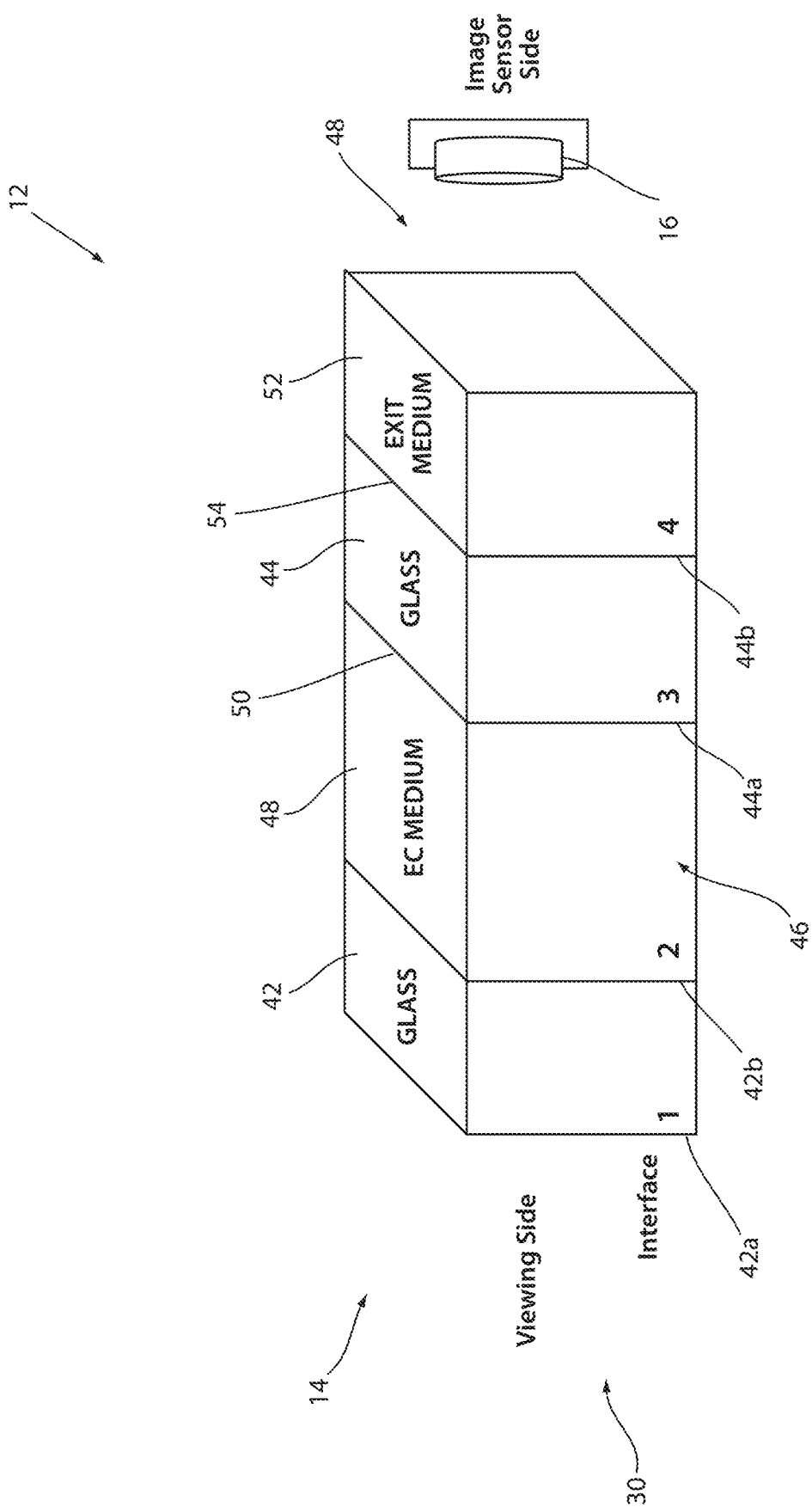
FIG. 3 is a cross-sectional view of an electro-optic assembly.

Further details describing various embodiments of electro-optic assemblies are discussed in reference to FIG. 3.

Figure 4A:
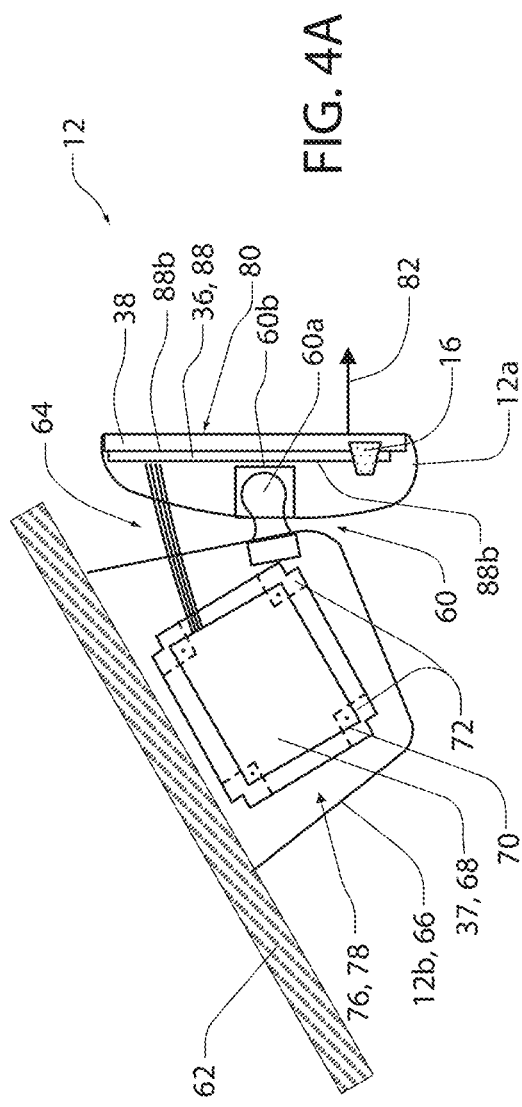
FIG. 4A is a detailed cross-sectional side view of a mirror assembly comprising a scanning apparatus.
Figure 4B:
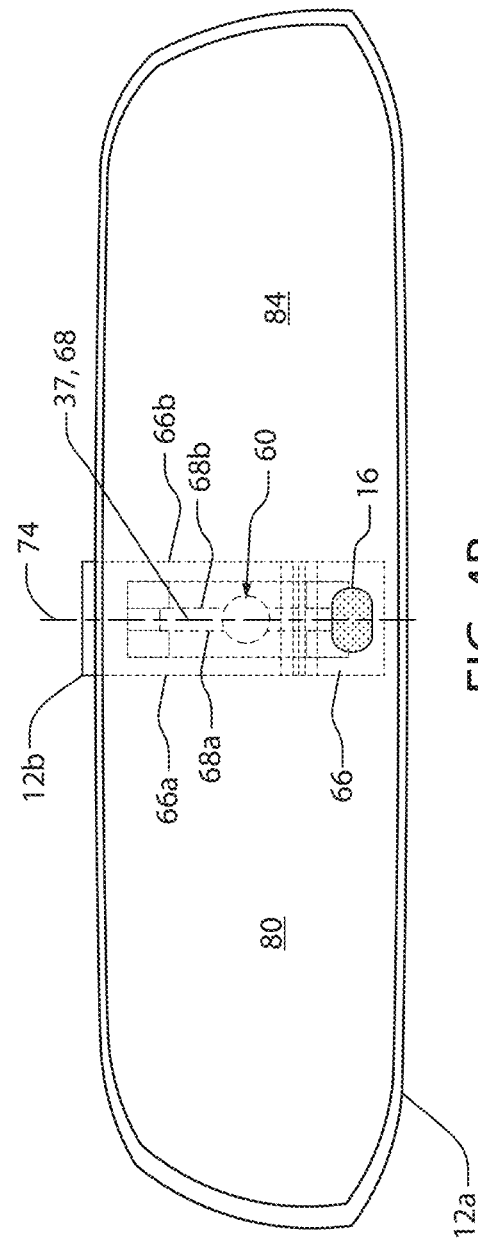
FIG. 4B is a detailed front view of a mirror assembly comprising a scanning apparatus.

The image sensor 16 may be disposed on a circuit 36, for example, a printed circuit board, which may be disposed in a display housing 12a and/or mirror housing of the rearview display assembly 12. The circuit 36 may further be in communication with a controller 37. The controller 37 may be disposed in an enclosure, which may form a portion of the support housing 12b as shown in FIGS. 4A and 4B. The support housing 12b may be in connection with a windshield, a headliner, a roof portion, an overhead console or various panels/portions of the vehicle. In this configuration, the support housing 12b may be positioned between the windshield and a display housing 12a of the display assembly 12. Detailed drawings demonstrating the display housing 12a and a support housing 12b are shown and further discussed in reference to FIGS. 4A and 4B.

In some embodiments, the controller 37 may be in communication with various vehicle systems and accessories via a communication bus or any other suitable communication interface. The controller 37 may comprise one or more processors or circuits, which may be configured to process image data received from the image sensor 16. In this configuration, the image data may be communicated from the image sensor 16 to the controller 37. The controller 37 may process the image data with one or more algorithms configured to determine an identity of the operator of the vehicle. Further detailed discussion of the controller 37 and the various devices that may be in communication therewith are discussed in reference to FIG. 4.

The controller 37 may further be in communication with a display 38. The display 38 may be disposed in the display assembly 12 behind the rear surface. The controller 37 communicates image data received from the image sensor 16 for display on the display 38. In this configuration, an operator or occupant of the vehicle may preview the image data as an aiming process for the capture of the image data for the biometric authentication. In this configuration, the operator 22 may adjust a position of the eyes shown on the display 38 to position the eyes such that the image data may include the necessary features required to identify the operator. In an exemplary embodiment, the features required to identify the operator of the vehicle may correspond to features of the eyes of the operator 22 (e.g., the irises).

The display 38 may correspond to a partial or full display mirror configured to display an image data through at least a portion of the display assembly 12. The display 38 may be constructed utilizing various technologies, for example, LCD, LED, OLED, plasma, DLP or other display technology. Examples of display assemblies that may be utilized with the disclosure may include U.S. Pat. No. 6,572,233 "REARVIEW MIRROR WITH DISPLAY," U.S. Pat. No. 8,237,909 entitled "VEHICULAR REARVIEW MIRROR ASSEMBLY INCLUDING INTEGRATED BACKLIGHTING FOR A LIQUID CRYSTAL DISPLAY (LCD)," U.S. Pat. No. 8,411,245 "MULTI-DISPLAY MIRROR SYSTEM AND METHOD FOR EXPANDED VIEW AROUND A VEHICLE," and U.S. Pat. No. 8,339,526 "VEHICLE REARVIEW MIRROR ASSEMBLY INCLUDING A HIGH INTENSITY DISPLAY," which are incorporated herein by reference in their entirety.

The scanning apparatus 10 may further comprise an indicator 40 in the display assembly 12. The indicator 40 may be in communication with the controller 37 and configured to output a signal to identify a state of the scanning apparatus 10 and/or a rearview camera as discussed in reference to FIG. 5. The indicator 40 may correspond to a light source that may be operable to flash and/or change colors to communicate a state of the scanning apparatus 10.

The indicator 40 may correspond to a light emitting diode (LED), and in an exemplary embodiment, the indicator 40 may correspond to a red, green, and blue (RGB) LED operable to identify the state of the scanning apparatus 10 by outputting one or more colored emissions of light.

The various components of the electro-optic assembly 14 and the scanning apparatus 10 may be contained within a housing 41 of the display assembly 12. In this way, the various components discussed herein may be substantially hidden from a view of the operator 22. Accordingly, the disclosure may provide for various advanced functions from the electro-optic assembly 14 and the scanning apparatus 10 while maintaining an appearance of a conventional rearview mirror.

Referring to FIG. 3, a cross-sectional view of an electro-optic assembly 14 is shown. The electro-optic assembly 14 may be partially reflective and partially transmissive and comprise the mirror element 34. The mirror element 34 may include a first substrate 42 having a first surface 42*a* and a second surface 42*b*. The mirror element 34 may further comprise a second substrate 44 having a third surface 44*a* and a fourth surface 44*b*. The first substrate 42 and the second substrate 44 may define a cavity 46 and may be substantially parallel. The first surface 42*a* and the third surface 44*a* may be oriented toward the front surface 30 of the mirror display assembly 12. The second surface 42*b* and the fourth surface 44*b* may be oriented toward a rear surface of the mirror display assembly 12 or a housing of the mirror display assembly 12. In this configuration, the contents of the housing including the image sensor 16 and the light source may be significantly hidden from view by the electro-optic assembly 14.

Though described as being disposed behind the electro-optic assembly 14, in some embodiments, the infrared emitters or the light source 18 may otherwise be attached to or disposed within the housing 41. Additionally, the at least one light source 18 may be remotely located relative to the mirror display assembly 12. In such embodiments, the light source 18 may be in communication with the controller 37 of the scanning apparatus 10. In the various embodiments, the light source 18 may be configured to project the emission 20 of light in the NIR range such that the image sensor 16 may receive light reflected from a subject of the scanning apparatus 10 (e.g., a passenger or operator). Accordingly, the scanning apparatus 10 may be utilized to suit a variety of applications without departing from the spirit of the disclosure.

The cavity 46 may contain an electro-optic medium 48, such as, but not limited to, an electrochromic medium. The cavity 46 may be completely or partially filled with the medium 48. The mirror assembly 12 may be in communication with a dimming controller via electrical contacts and may comprise various seals to retain the medium 48 in the cavity 46. In this configuration, the mirror assembly 12 may correspond to an electrochromic mirror element configured to vary in reflectivity in response to a control signal received from the dimming controller via the electrical contacts. The control signal may change an electrical potential supplied to the mirror assembly 12 to control the reflectivity.

Each of the surfaces 42*a*, 42*b*, 44*a*, and 44*b* correspond to interfaces of the mirror display assembly 12. The first surface 42*a* corresponds to a first interface 1. The second surface 42*b* corresponds to a second interface 2. The third surface 44*a* corresponds to a third interface 3. The fourth surface 44*b* corresponds to a fourth interface 4. In a conventional electro-optic assembly, a transflective coating 50 may typically be disposed on the third interface 3. The transflective coating 50 may typically comprise a layer containing silver along with additional layers such as metal, dielectric and/or transparent conducting oxides located above or below the silver comprising layer or both.

Referring to FIGS. 4A and 4B, a side cross-sectional view and a front view of the display assembly 12 are shown, respectively. In an exemplary embodiment, the display assembly 12 comprises the display housing 12*a* in connection with a support housing 12*b* via a connection interface 60. The connection interface 60 may comprise a ball 60*a* in connection with a socket 60*b* such that the display housing 12*a* may be oriented in a variety of directions relative to the support housing 12*b*. The support housing 12*b* may be in connection with a windshield 62, a headliner, a roof portion, an overhead console or various panels/portions of the vehicle. In this configuration, the support housing 12*b* may be thermally isolated from the display housing 12*a* due to the limited conductivity through the connection interface 60. Additionally, the ball and socket connection configuration may provide for the connection interface 60 to support the display housing 12*a* while providing a multi-axial rotation of the display housing 12*a* relative to the support housing 12*b*. In this configuration, the controller 37 may be thermally isolated from the image sensor 16 by the connection interface 60 throughout a full range of the multi-axial rotation of the display housing 12*a* relative to the support housing 12*b*.

As previously discussed, the image sensor 16 may be disposed on a circuit 36, for example, a printed circuit board, which may be disposed in the display housing 12*a* of the rearview display assembly 12. The circuit 36 may further be in communication with the controller 37 via a communication interface 64. The controller 37 may be disposed in an enclosure 66 in connection with a support housing 12*b*. The communication interface 64 may extend from the controller 37 in the enclosure 66 to the control circuit 36 in the display housing 12*a*. The control circuit 36 may be in communication with the display 38, the image sensor 16 and various additional components that may be disposed in the display housing 12*a*. In this configuration, the controller 37 may be in communication with the various components disposed in the display housing 12*a* while maintaining substantial thermal isolation from the control circuit 36 and various components disposed in the display housing 12*a*.

The controller 37 may correspond to one or more processors, memory devices, and/or circuits, which may be incorporated on a first printed circuit board (PCB) 68. The first PCB 68 may comprise a first surface 68*a* and a second surface 68*b* defined by a plurality of edges extending along a perimeter 70 of the surfaces 68*a*, 68*b*. The enclosure 66 may be in connection with the first PCB 68 via at least one connection support 72, which may be formed as an integral part of the enclosure 66. In this configuration, the enclosure 66 may comprise an assembly, which may be assembled along a parting line 74 such that the at least one connection support 72 may be connected to the first PCB 68 and enclosed within the enclosure 66. In this way, the enclosure 66 of the support housing 12*b* may be configured to house the controller 37 as well as support the display housing 12*a* via the connection interface 60.

The enclosure 66 may form an interior pocket 76 configured to receive and enclose the first PCB 68. In this configuration, the enclosure 66 may provide for an air gap 78 or volume formed around the first PCB 68 such that the surfaces 68*a*, 68*b* and the perimeter 70 are separated from the enclosure 66 where the first PCB 68 is not supported by the at least one connection support 72. Additionally, the support housing 12b may be configured such that the first surface 68a and the second surface 68b extend substantially perpendicular from the windshield 62. Additionally, the first surface 68a and the second surface 68b may align substantially perpendicular with a display plane 80 of the display housing 12a in a neutral orientation of the connection interface 60. The neutral orientation may correspond to the orientation depicted in FIGS. 4A and 4B wherein a normal vector 82 of a display surface 84 of the display 38 is directed in a rearward operating direction of the vehicle and away from the windshield 62.

As demonstrated in the neutral orientation, a first enclosure surface 66a and a second enclosure surface 66b of the enclosure 66 may extend along the first surface 68a and the second surface 68b, respectively. In this configuration, a thermal transfer from the first enclosure surface 66a and the second enclosure surface 66b are exposed to the environment in the passenger compartment 13 surrounding the display assembly 12. Such an arrangement provides for improved cooling of the enclosure 66 and the controller 37 and isolation of the controller 37 from the circuit 36, the display 38 and various elements incorporated in the display housing 12a.

The circuit 36 may be disposed in the display housing 12a and may comprise a second PCB 88. The second PCB 88 may extend parallel to the display plane 80 within the display housing 12a. The circuit 36 may be configured to communicate various signals and commands configured to control the display 38 and the image sensor 16, as well as various additional components, which may be housed within or in connection with the display housing 12a (e.g., the light source 18, the emitter banks 24 and 26, the indicator 40, etc.). Accordingly, a first surface 88a and a second surface 88b of the second PCB 88 may be aligned perpendicular to the first surface 68a and the second surface 68b of the first PCB 68 when the display housing 12a is arranged in the neutral configuration. More succinctly put, a planar surface of the first PCB 68 may be arranged perpendicular to a planar surface of the second PCB 88 in the neutral configuration.

Additionally, the connection interface 60 may provide for the display housing 12a to rotate about the ball 60a changing the orientation of the second PCB 88 and the display plane 80 relative to the orientation of the first PCB 68. However, the display assembly may be configured to maintain an intersecting alignment between the planar surfaces of the first PCB 68 and the second PCB 88 regardless of the orientation of the display housing 12a rotated about the ball 60a. Accordingly, the display assembly 12 may provide for physical and thermal isolation of the controller 37 from the display housing 12a via the separation provided by the connection interface 60.

Figure 5:
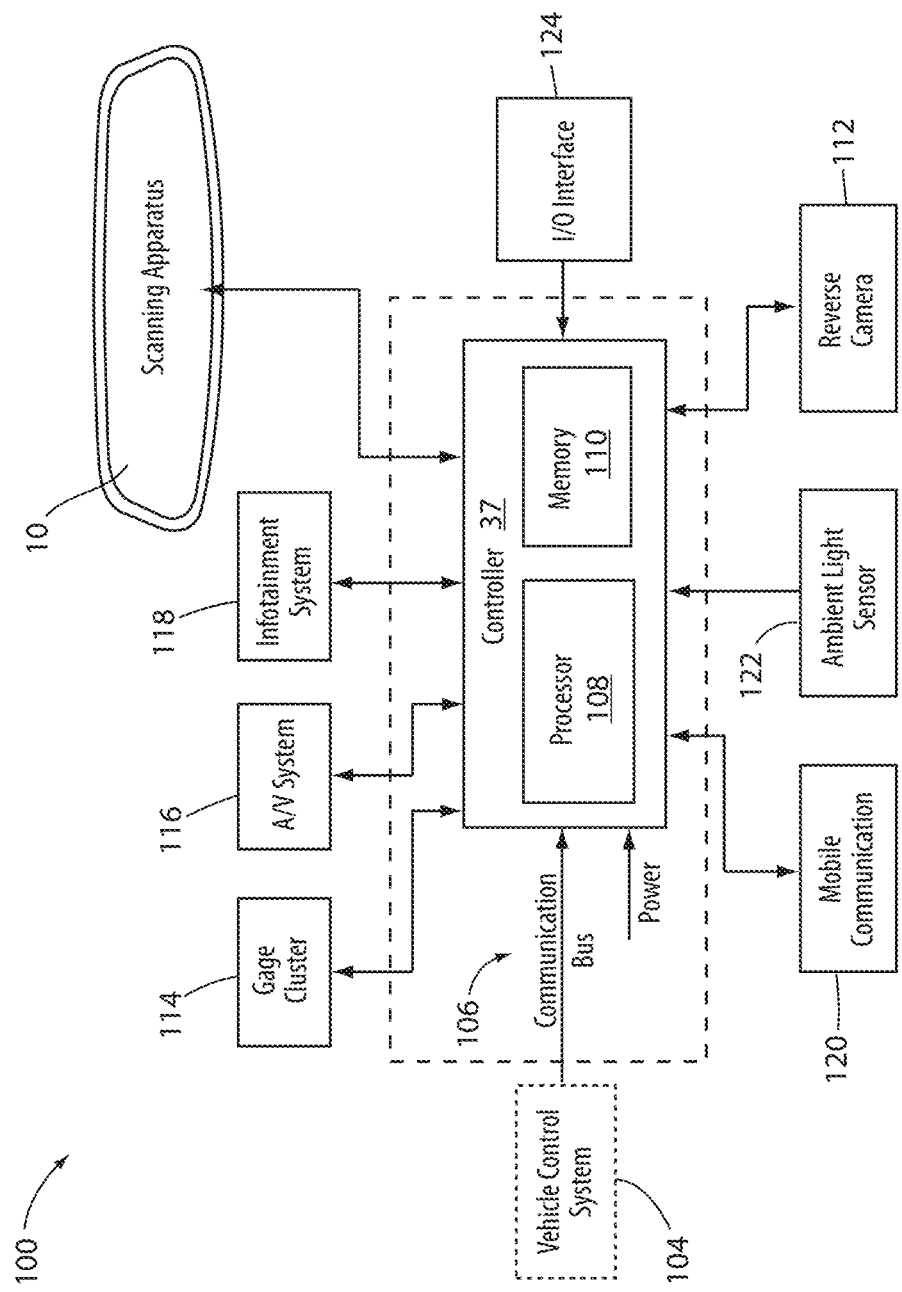
FIG. 5 is a block diagram of an identification system incorporating a scanning apparatus disposed in a mirror assembly in accordance with the disclosure.

Referring to FIG. 5, a block diagram of an identification system 100 incorporating the scanning apparatus 10 is shown. The controller 37 is shown in communication with the scanning apparatus 10, which may be disposed in the display housing with the display 38. The controller 37 may also be in communication with the vehicle control module 104 via a communication bus 106 of the vehicle. The communication bus 106 may be configured to deliver signals to the controller 37 identifying various vehicle states. For example, the communication bus 106 may be configured to communicate to the controller 37 a drive selection of the vehicle, an ignition state, a door open or ajar status, a remote activation of the scanning apparatus 10. Such information and control signals may be utilized by the controller 37 to activate or adjust various states and/or control schemes of the scanning apparatus 10 and/or the display assembly 12.

The controller 37 may comprise a processor 108 having one or more circuits configured to receive the signals from the communication bus 106 and control the scanning apparatus 10. The processor 108 may be in communication with a memory 110 configured to store instructions to control operations of the scanning apparatus 10. For example, the controller 37 may be configured to store one or more characteristics or profiles utilized by the controller 37 to identify the operator 22 of the vehicle. In this configuration, the controller 37 may communicate operating and identification information with the scanning apparatus 10 to identify the operator of the vehicle. Additionally, based on the identification of the operator 22, the controller 37 may be configured to control and/or communicate with additional systems of the vehicle. Such systems may include a security system, speed governor, radio/infotainment system, etc. In this way, one or more systems of the vehicle may be controlled or restricted based on the identity of the operator.

In some embodiments in response to an identification of a passenger or operator of the vehicle, the controller 37 may access a database of stored driver preferences to customize aspects of the vehicle or driver experience. For example, the controller 37 may access and enable radio station presets according to a driver's pre-established preferences. Navigation and/or map display settings may be changed or set according to a driver's pre-established preferences. Additionally, the database may comprise navigation information comprising known or previously visited locations. In particular, a route to home, work, or other frequently visited locations may be preset upon identification of a driver based on previous use or programming stored in the database.

The controller 37 may further be in communication with a reverse camera 112 or any other form of vehicle camera system. The controller 37 may receive image data from the reverse camera 112 corresponding to a rearward-directed field of view relative to the vehicle. In this configuration, the display 38 may provide for the rearward-directed field of view to be displayed when the display 38 is not utilized as for the identification process. The controller 37 may further be in communication with one or more of a gauge cluster 114, an audio/video (A/V) system 116, an infotainment system 118, a media center, a vehicle computing system, and/or various other devices or systems of the vehicle. In various embodiments, the controller 37 may display image data from at least one of the image sensor 16 and the reverse camera 112 on the devices 114-118.

In an exemplary embodiment, the controller 37 may correspond to one or more processors or circuits. The controller 37 may be configured to process image data received from the image sensor 16. In this configuration, the controller 37 may process the image data with one or more algorithms configured to determine an identity of the operator of the vehicle. With the identity of the operator or one or more passengers of the vehicle identified, the controller 37 may further be operable to control various systems or functions of the vehicle.

For example, the controller 37 may be configured to authorize various settings or restrictions of settings for the vehicle based on an identification of the operator of the vehicle. The authorization may correspond to a speed governor, a payment authorization for toll roads or other transactional functions, a log of usage and timing for an identified operator, etc. In some implementations, the scanning apparatus may also be configured to document information corresponding to the usage and timing, for example, the number of passengers, a top speed of the vehicle, a maximum rate of acceleration, etc. In some embodiments, the controller 37 may further be in communication with a global position system (GPS) that may also provide regional restrictions for the operation of the vehicle.

In some embodiments, the controller 37 may utilize the identification of the operator of the vehicle to report updates to an administrator of the vehicle. For example, in some embodiments, the controller may further be in communication with a mobile communication system 120. The mobile communication system may be configured to communicate via various mobile communication protocols. Wireless communication protocols may operate in accordance with communication standards including, but not limited to the following: Institute of Electrical and Electronic Engineering (IEEE) 802.11 (e.g., WiFi™); Bluetooth®; advanced mobile phone services (AMPS); digital AMPS; global system for mobile communications (GSM); code division multiple access (CDMA); Long Term Evolution (LTE or 4G LTE); local multipoint distribution systems (LMDS); multi-channel-multi-point distribution systems (MMDS); RFID; and/or variations thereof. In this configuration, the controller 37 may be configured to send an alert or message to the administrator of the vehicle in response to one or more predetermined events. The alert or message may correspond to a text message, data message, email, alert via an application operating on a smart device, etc.

The controller 37 may further be in communication with an ambient light sensor 122. The ambient light sensor 122 may be operable to communicate a light condition, for example, a level brightness or intensity of the ambient light proximate the vehicle. In response to the level of the ambient light, the controller 37 may be configured to adjust a light intensity output from the display. In this configuration, the operator of the controller may adjust the brightness of the display to provide image data captured by at least one of the image sensor 16 and the reverse camera.

The controller 37 may further be in communication with an interface 124 configured to receive one or more inputs configured to control at least one of the scanning apparatus 10 and the reverse camera 112. In some embodiments, the interface 124 may be combined with one or more devices of the vehicle. For example, the interface 124 may form a portion of the gauge cluster 114, the A/V system 116, the infotainment system 118, a display console and/or various input/output devices that may commonly be utilized in automotive vehicles (e.g., a steering switch, steering wheel controls, etc.). In this way, the disclosure provides for various control schemes for implementing the scanning apparatus 10 in a vehicle.

In some embodiments, the interface 124 may alternatively or additionally correspond to a keypad, fingerprint scanner, facial scanner, etc. In such configurations, the controller 37 may be operable to authenticate or identify a passenger or operator of the vehicle based on a multi-factor identification process. For example, the controller 37 may be configured to identify an operator or passenger of the vehicle in response to a first authentication and a second authentication. The first authentication may correspond to an iris scan detected via the scanning apparatus 10. The second authentication may correspond to a code or PIN entry into the keypad, a fingerprint scan via the fingerprint scanner, a facial scan via a camera or the scanning apparatus, etc. In this way, the disclosure may provide various levels of authentication for a variety of applications.

The mirror element 34 may be an electrochromic element or an element, such as a prism. One non-limiting example of an electrochromic element is an electrochromic medium, which includes at least one solvent, at least one anodic material, and at least one cathodic material. Typically, both of the anodic and cathodic materials are electroactive and at least one of them is electrochromic. It will be understood that regardless of its ordinary meaning, the term "electroactive" will be defined herein as a material that undergoes a modification in its oxidation state upon exposure to a particular electrical potential difference. Additionally, it will be understood that the term "electrochromic" will be defined herein, regardless of its ordinary meaning, as a material that exhibits a change in its extinction coefficient at one or more wavelengths upon exposure to a particular electrical potential difference. Electrochromic components, as described herein, include materials whose color or opacity are affected by electric current, such that when an electrical current is applied to the material, the color or opacity change from a first phase to a second phase. The electrochromic component may be a single-layer, single-phase component, multi-layer component, or multi-phase component, as described in U.S. Pat. No. 5,928,572 entitled "ELECTROCHROMIC LAYER AND DEVICES COMPRISING SAME," U.S. Pat. No. 5,998,617 entitled "ELECTROCHROMIC COMPOUNDS," U.S. Pat. No. 6,020,987 entitled "ELECTROCHROMIC MEDIUM CAPABLE OF PRODUCING A PRE-SELECTED COLOR," U.S. Pat. No. 6,037,471 entitled "ELECTROCHROMIC COMPOUNDS," U.S. Pat. No. 6,141,137 entitled "ELECTROCHROMIC MEDIA FOR PRODUCING A PRESELECTED SELECTED COLOR," U.S. Pat. No. 6,241,916 entitled "ELECTROCHROMIC SYSTEM," U.S. Pat. No. 6,193,912 entitled "NEAR INFRARED-ABSORBING ELECTROCHROMIC COMPOUNDS AND DEVICES COMPRISING SAME," U.S. Pat. No. 6,249,369 entitled "COUPLED ELECTROCHROMIC COMPOUNDS WITH PHOTOSTABLE DICATION OXIDATION STATES," and U.S. Pat. No. 6,137,620 entitled "ELECTROCHROMIC MEDIA WITH CONCENTRATION-ENHANCED STABILITY, PROCESS FOR THE PREPARATION THEREOF AND USE IN ELECTROCHROMIC DEVICES," U.S. Pat. No. 6,519,072, entitled "ELECTROCHROMIC DEVICE," and International Patent Publication Nos. WO98/42796 entitled "ELECTROCHROMIC POLYMERIC SOLID FILMS, MANUFACTURING ELECTROCHROMIC DEVICES USING SUCH SOLID FILMS, AND PROCESSES FOR MAKING SUCH SOLID FILMS AND DEVICES," and WO99/02621 entitled "ELECTROCHROMIC POLYMER SYSTEM," which are herein incorporated by reference in their entirety. The glass element of display assembly 12 may also be any other element having partially reflective, partially transmissive properties. To provide electric current to the glass element of display assembly 12, electrical elements are provided on opposing sides of the element, to generate an electrical potential therebetween. A J-clip 54 is electrically engaged with each electrical element, and element wires extend from the J-clips 54 to the primary PCB 68.

The present disclosure may be used with a mounting system such as that described in U.S. Pat. Nos. 8,814,373; 8,201,800; 8,210,695; 9,174,577; 8,925,891; 9,838,653; 8,960,629; and 9,244,249, which are hereby incorporated herein by reference in their entirety. Further, the present disclosure may be used with a rearview packaging assembly such as that described in U.S. Pat. Nos. 8,814,373; 8,646,924; 8,643,931; 8,264,761; 8,885,240; 9,056,584; 9,701,248; 9,316,347; 10,191,348; and 10,345,672, which are hereby incorporated herein by reference in their entirety. Additionally, it is contemplated that the present disclosure can include a bezel such as that described in U.S. Pat. Nos. 8,827,517; 8,210,695; and 8,201,800, which are hereby incorporated herein by reference in their entirety.

It will be understood by one having ordinary skill in the art that construction of the described invention and other components is not limited to any specific material. Other exemplary embodiments of the invention disclosed herein may be formed from a wide variety of materials unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the invention as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:

1. A scanning apparatus for a vehicle configured to process a biometric scanning operation, the apparatus comprising:
   a display housing comprising a display device forming a display plane;
   a support housing in supportive connection with the display housing, wherein the support housing is in connection with a connection surface of a portion of the vehicle and forms an interior cavity extending substantially perpendicular from the connection surface; and
   a first printed circuit board (PCB) disposed in the interior cavity, wherein the first PCB comprises a plurality of planar faces terminating at a plurality of edges, wherein the planar faces extend substantially perpendicular to the connection surface.

2. The apparatus according to claim 1, further comprising a connection interface adjustably connecting the display housing to the support housing.

3. The apparatus according to claim 2, wherein connection interface comprises a ball and socket connection.

4. The apparatus according to claim 3, further comprising:
   an image sensor disposed in the display housing and in communication with a second PCB, wherein the image sensor is configured to capture biometric data for the biometric scanning operation.

5. The apparatus according to claim 4, wherein the first PCB comprises a controller in communication with the image sensor via a communication interface.

6. The apparatus according to claim 5, wherein the controller is configured to:
   receive the biometric data from the image sensor; and
   identify a passenger of the vehicle by processing the biometric data.

7. The apparatus according to claim 5, wherein the imager disposed in the display housing is thermally isolated from the controller in the support housing by the connection interface.

8. The apparatus according to claim 5, wherein the connection interface is configured to support the display housing while providing a multi-axial rotation of the display housing relative to the support housing.

9. The apparatus according to claim 8, wherein the controller is thermally isolated from the image sensor by the connection interface throughout a full range of the multi-axial rotation of the display housing relative to the support housing.

10. The apparatus according to claim 1, wherein the planar faces of the first PCB are arranged substantially perpendicular to the display surface in a neutral mounting configuration, wherein the display surface is directed rearward relative to an operating direction of the vehicle.

11. The apparatus according to claim 10, further comprising:
    a second PCB disposed in the display housing parallel to the display plane and in communication with the display device and an image sensor, wherein the second PCB is in communication with the first PCB.

12. The apparatus according to claim 11, wherein the second PCB is arranged perpendicular to the first PCB in a neutral orientation of the display housing directed into a passenger compartment of the vehicle.

13. The apparatus according to claim 1, wherein the connection surface comprises one of a windshield, a headliner, a roof portion, and an overhead console of the vehicle.

14. The apparatus according to claim 1, wherein the support housing comprises an enclosure forming the internal cavity and the enclosure forms an air gap separating the planar faces of the PCB from the enclosure.

15. The apparatus according to claim 1, wherein the perpendicular orientation of the planar face extends along a normal vector extending from the connection surface.

16. A scanning apparatus for a vehicle configured to process a biometric scanning operation, the apparatus comprising:

a support housing in connection with a connection surface of a portion of the vehicle forms an interior cavity extending substantially perpendicular from the connection surface;

a first printed circuit board (PCB), comprising a controller disposed in the interior cavity, wherein the first PCB comprises a plurality of planar faces extending substantially perpendicular to the connection surface;

a display housing in connection with the support housing via a connection interface, wherein an image sensor and a display device are disposed in the display housing; and a second PCB disposed in the display housing and in communication with the display device, the image sensor, and the first PCB; and wherein the controller is configured to process image data captured by the image sensor.

17. The apparatus according to claim 16, wherein the controller is configured to identify a passenger of the vehicle by processing the image data.

18. The apparatus according to claim 16, wherein the imager disposed in the display housing is thermally isolated from the controller in the support housing by the connection interface.

19. A scanning apparatus for a vehicle configured to process a biometric scanning operation, the apparatus comprising:

a display housing comprising a display device forming a display plane and an image sensor configured to capture image data in the vehicle;

a support housing in supportive connection with the display housing via a connection interface, wherein the support housing is in connection with a connection surface of a portion of the vehicle and forms an interior cavity extending substantially perpendicular from the connection surface; and a first printed circuit board (PCB) comprising a controller configured to process the image data disposed in the interior cavity, wherein the first PCB comprises a plurality of planar faces terminating at a plurality of edges, wherein the planar faces extend substantially perpendicular to the connection surface; and wherein the connection interface is configured to support the display housing while providing a multi-axial rotation of the display housing relative to the support housing.

20. The apparatus according to claim 19, wherein the controller is thermally isolated from the image sensor by the connection interface throughout a full range of the multi-axial rotation of the display housing relative to the support housing.

* * * * *